(12) United States Patent
Ray et al.

(10) Patent No.: US 9,985,641 B1
(45) Date of Patent: May 29, 2018

(54) SYSTEMS AND METHODS FOR EVALUATING ERRORS AND IMPAIRMENTS IN A DIGITAL-TO-ANALOG CONVERTER

(71) Applicant: Keysight Technologies, Inc., Minneapolis, MN (US)

(72) Inventors: Sourja Ray, Cupertino, CA (US); Jacky Kin Chi Liu, Santa Clara, CA (US)

(73) Assignee: Keysight Technologies, Inc., Santa Rosa, CA (US)

(*) Notice: Subject to any disclaimer, the term of this patent is extended or adjusted under 35 U.S.C. 154(b) by 0 days. days.

(21) Appl. No.: 15/606,100

(22) Filed: May 26, 2017

(51) Int. Cl.
    *H03M 1/10* (2006.01)

(52) U.S. Cl.
    CPC ................. *H03M 1/1071* (2013.01)

(58) Field of Classification Search
    CPC ................................... H03M 1/1071
    USPC .................................. 341/120–144
    See application file for complete search history.

(56) References Cited

U.S. PATENT DOCUMENTS

| | | | |
|---|---|---|---|
| 6,331,830 B1 | 12/2001 | Song | |
| 6,906,652 B2 | 6/2005 | Bugeja | |
| 7,042,379 B2 | 5/2006 | Choe | |
| 7,068,194 B1* | 6/2006 | Taft | H03M 1/0602 341/136 |
| 8,031,098 B1 | 10/2011 | Ebner | |
| 9,041,577 B2 | 5/2015 | Bore | |
| 9,509,326 B1 | 11/2016 | Kauffman | |
| 9,577,657 B1* | 2/2017 | Clara | H03M 1/1009 |
| 9,602,225 B2* | 3/2017 | Baney | H04B 17/0085 |
| 9,667,358 B2* | 5/2017 | Baney | H04B 17/11 |
| 9,742,421 B2* | 8/2017 | Zhu | H03M 1/08 |
| 2012/0080080 A1* | 4/2012 | Shalit | G02B 5/223 136/252 |
| 2013/0222168 A1* | 8/2013 | Clara | H03M 1/1061 341/150 |
| 2015/0048959 A1* | 2/2015 | Zhu | H03M 1/0617 341/118 |
| 2016/0094235 A1* | 3/2016 | Kuttner | H03M 1/662 341/144 |

OTHER PUBLICATIONS

Bob Jewett et al, "A 1.2GS/s 15b DAC for Precision signal Generation" 2005 IEEE International Solid-State Circuits Conference.

Frank Van De Sande et. al. "A 7.2 GSa/s, 14 Bit or 12 GSa/s, 12 bit Signal Generator on a Chip in a 165 GHz ft BiCMOS Process" Apr. 2012, IEEE Journal of Solid-State Circuits.

* cited by examiner

*Primary Examiner* — Lam T Mai

(57) ABSTRACT

Exemplary embodiments of the present invention pertain to circuitry provided in a digital-to-analog converter (DAC) for carrying out measurements indicative of various performance characteristics of the DAC. In one exemplary implementation, a control circuit containing one or more switches is used to controllably route into a measurement system, a portion of a signal that straddles a boundary between a first digital data bit and a second digital data bit in a sequence of digital data bits that are received in a DAC cell of the DAC. The control circuit, which can be included in one or more DAC cells of the DAC, is connected to a branch of a differential circuit that is provided in each of the DAC cells of the DAC, in a manner that does not affect digital-to-analog conversion in the DAC cells.

20 Claims, 12 Drawing Sheets

SYSTEMS AND METHODS FOR EVALUATING ERRORS AND IMPAIRMENTS IN A DIGITAL-TO-ANALOG CONVERTER

BACKGROUND

A digital-to-analog converter (DAC) converts digital data bits into analog signals. The quality of the resulting analog signals provided at an output of a DAC depends upon various characteristics of the DAC. Some of these characteristics can degrade the analog signal as a result of errors introduced during the conversion process. Several factors may contribute to these errors. Some factors include hardware elements inside the DAC that can cause variations in current flows, hardware elements inside the DAC that can cause variations in switching times, and/or hardware elements inside the DAC having improper layout geometries. Evaluating the operating parameters of a DAC, particularly the shapes and the timing characteristics of various signals inside the DAC, can be a first step in identifying and addressing at least some of these errors.

SUMMARY

Exemplary embodiments of the present invention pertain to circuitry that is provided within a digital-to-analog converter (DAC) for carrying out measurements indicative of various performance characteristics of the DAC. In one exemplary implementation, a control circuit containing one or more switches is used to controllably route into a measurement system, a portion of a signal that straddles a boundary between a first digital data bit and a second digital data bit in a sequence of digital data bits that are input into a DAC cell of the DAC. A transitioning edge can occur at the boundary when the first digital data bit is different than the second digital data bit. The control circuit, which can be included in one or more DAC cells of the DAC, is connected to a branch of a differential circuit that is provided in each of the DAC cells, in a manner that does not affect digital-to-analog conversion in the DAC cells.

According to one exemplary embodiment of the present invention, a digital-to-analog converter includes a first digital-to-analog converter cell that is configured to receive a control signal and a sequence of digital data bits. The sequence of digital data bits includes a first digital data bit followed by a second digital data bit. The first digital-to-analog converter cell includes a differential circuit configured to operate upon the sequence of digital data bits by discarding a first portion of the sequence of digital data bits when the control signal indicates a first action, and coupling the first portion of the sequence of digital data bits into a measurement node when the control signal indicates a second action. The first portion of the sequence of digital data bits encompasses a region that straddles a boundary between the first digital data bit and the second digital data bit.

According to another exemplary embodiment of the present invention, a digital-to-analog converter includes a first digital-to-analog converter cell that includes a first transistor, a second transistor, and a control circuit. The first transistor, which is a part of a trunk section of a differential circuit, is configured to receive a sequence of digital data bits that includes a first digital data bit followed by a second digital data bit. The second transistor, which is a part of a first branch of the differential circuit, is configured to receive a first input signal that permits propagation of a first current through the first branch of the differential circuit only when the first transistor receives a first portion of the sequence of digital data bits. The first portion encompasses a boundary between the first digital data bit and the second digital data bit According to yet another exemplary embodiment of the present invention, a method includes: providing a digital-to-analog converter comprising a first digital-to-analog converter cell; receiving a control signal and a sequence of digital data bits in the first digital-to-analog converter cell, the sequence of digital data bits comprising a first digital data bit followed by a second digital data bit; coupling the sequence of digital data bits into a differential circuit that is part of the first digital-to-analog converter cell; and using the differential circuit to discard a first portion of the sequence of digital data bits when the control signal indicates a first action and to couple the first portion of the sequence of digital data bits into a measurement node when the control signal indicates a second action, the first portion of the sequence of digital data bits encompassing a boundary between the first digital data bit and the second digital data bit Other embodiments of the present invention will become apparent from the following description taken in conjunction with the associated drawings.

BRIEF DESCRIPTION OF THE FIGURES

Many aspects of the invention can be better understood by referring to the following description in conjunction with the accompanying claims and figures. Like numerals indicate like structural elements and features in the various figures. For clarity, not every element may be labeled with numerals in every figure. The drawings are not necessarily drawn to scale; emphasis instead being placed upon illustrating the principles of the invention. The drawings should not be interpreted as limiting the scope of the invention to the example embodiments shown herein.

DETAILED DESCRIPTION

Throughout this description, embodiments and variations are described for the purpose of illustrating uses and implementations of inventive concepts. The illustrative description should be understood as presenting examples of inventive concepts, rather than as limiting the scope of the concepts as disclosed herein. Towards this end, certain words and terms are used herein solely for convenience and such words and terms should be broadly understood as encompassing various objects and actions that are generally understood in various forms and equivalencies by persons of ordinary skill in the art. For example, the word "line" as used herein can refer to various types of physical connections (wires, metal tracks in a printed circuit board, etc.) between two components; the word "circuit" as used herein can refer to a number of components located inside an integrated circuit and/or a number of components located on a printed circuit board; the phrase "digital signal" as used herein generally refers to a digital bit that can be provided in a binary format (1/0) or in any multi-level format; and the phrase "DAC cell" refers to a portion of a DAC that operates at any one time upon one bit of a digital byte or a word that is provided to the DAC. The words "signal" and "bit" may be used interchangeably as a matter of convenience in some instances. Similarly, the words "logic state" and "logic level" may be used interchangeably as a matter of convenience in some instances. It should also be understood that the word "example" as used herein is intended to be non-exclusionary and non-limiting in nature. More particularly, the word "exemplary" as used herein indicates one among several examples and it should be understood that no special emphasis, exclusivity, or preference, is associated or implied by the use of this word. It should also be pointed out that the transitioning edges of various waveforms shown in the figures are shown as vertical edges merely for convenience and for illustrating certain timing relationship between various transitioning edges. However, it should be understood that in real life, these transitioning edges have a finite transition time (slow rise time, slow fall time etc.) and suitable accommodations/adjustments have to be made to take these finite transition times into consideration.

Figure 1:
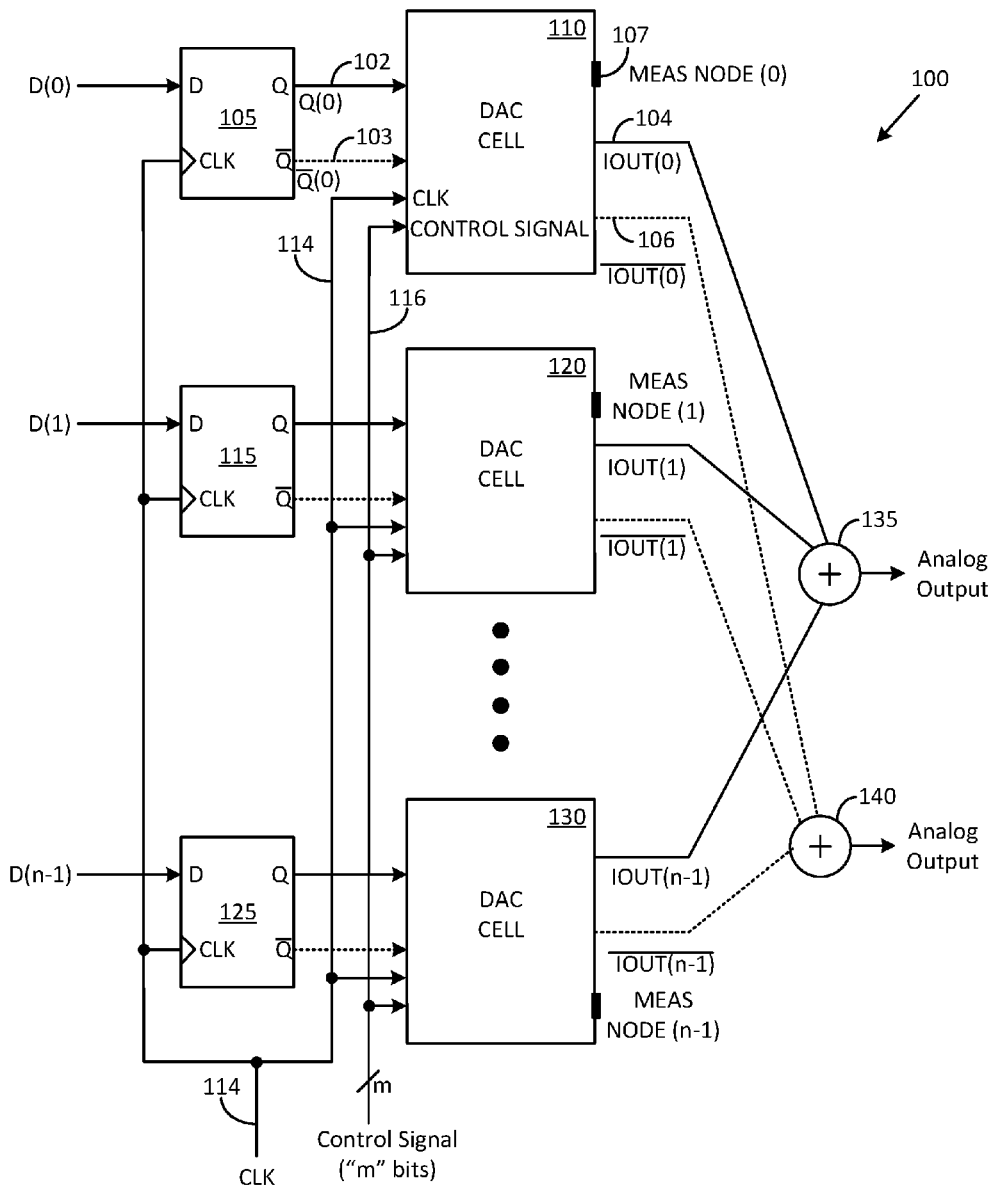
FIG. 1 illustrates an exemplary digital-to-analog converter (DAC) that includes a number of DAC cells, in accordance with an exemplary embodiment of the present invention.

FIG. 1 illustrates a digital-to-analog converter (DAC) 100 in accordance with an exemplary embodiment of the invention. DAC 100, which is a current DAC in this exemplary embodiment, incorporates "n" DAC cells where "n" indicates a size of a digital input signal that is coupled into the DAC 100 for conversion into an analog output. Consequently, an 8-bit DAC 100 will accept a byte input (8 bits) and convert the byte input into a corresponding analog output, while a 16-bit DAC 100 will accept a word input (16 bits) and convert the word input into a corresponding analog output. In the exemplary embodiment shown in FIG. 1, each individual digital data bit in an "n" bit wide digital input signal is synchronously coupled into a respective one of the "n" DAC cells, by using a clock (CLK) that is provided on a line 114.

Furthermore, in the exemplary embodiment shown in FIG. 1, "n" D flip-flops are shown as being used to clock the "n" digital data bits of the "n" bit wide digital input signal into the "n" DAC cells. In some implementations, the "n" D flip-flops can be physically incorporated inside the "n" DAC cells. DAC cell 110 receives (via D flip-flop 105) a digital data bit D(0) that corresponds to a least significant bit (LSB) of a digital input signal, DAC cell 120 receives (via D flip-flop 115) a digital data bit D(1) that corresponds to a bit next to the LSB of the digital input signal, and DAC cell 130 receives (via D flip-flop 125) a digital data bit D(n−1) that corresponds to a most significant bit (MSB) of the digital input signal. Merely as a matter of convenience, D flip-flop 105 and DAC cell 110 are used henceforth for purposes of description, and it should be understood that such description is equally applicable to each of the other D flip-flops and DAC cells of the DAC 100.

In one exemplary implementation, DAC cell 110 is configured to operate in a single-ended input mode of operation where only the Q output of the D flip-flop 105 is used as a single-ended digital input signal into the DAC cell 110 (via line 102). However, in another exemplary implementation, DAC cell 110 is configured to operate in a differential input mode of operation where the Q output of the D flip-flop 105 as well as the Q' output of the D flip-flop 105 are used as a differential mode digital input signal into the DAC cell 110 (via two lines—line 102 and line 103). The Q output of the D flip-flop 105 (and the Q' output of the D flip-flop 105, when used) are clocked into the DAC cell 110 using the clock (CLK) provided on line 114. The clocking of the Q output into the DAC cell 110 can be carried out by using an opposing clock edge (a falling clock edge, for example) to the clock edge used for clocking the digital data bit D(0) into the D flip-flop 105 (a rising clock edge, for example) so as to accommodate signal propagation delay in the D flip-flop 105.

An "m" bit control signal is also coupled into the DAC cell 110 via a line 116 for purposes of operating a control circuit (not shown) that will be described below in more detail. Though shown as coupled into all "n" DAC cells of the DAC 100, in some implementations, the "m" bit control signal can be provided to a fewer number of DAC cells, such as, for example, only DAC cell 110 and DAC cell 130.

The sequence of D(0) digital data bits (provided to the DAC cell 110 via the Q output of the D flip-flop 105) is converted into a current output IOUT(0) by the DAC cell 110. The current output IOUT(0) is propagated out of the DAC cell 110 via a line 104. More particularly, the DAC cell 110 operates to prevent signal perturbances in the sequence of D(0) digital data bits (such as transients that may be present in a transitioning edge between two adjacent digital data bits) from adversely affecting the current output IOUT (0). Furthermore, the DAC cell 110 includes the control circuit that is operated via the "m" bit control signal. The control circuit enables evaluating one or more characteristics of a portion of the sequence of D(0) digital data bits that encompasses a boundary between any two adjacent digital data bits. This portion is of specific interest because the boundary, which can include signal transients, typically provides amplitude-related and timing-related information about the sequence of D(0) digital data bits, thereby providing performance characteristics of the DAC cell 110. The amplitude-related and/or timing-related information derived from the DAC cell 110 can also be used in a comparative manner with respect to other DAC cells in the DAC 100 so as to determine overall performance characteristics of the DAC 100.

In one exemplary embodiment, a measurement node 107 is provided in the DAC cell 110. The measurement node 107 enables connection of a test instrument (such as an oscilloscope, an ammeter, or a voltmeter) for observing, examining, measuring, and/or evaluating various parameters of the sequence of D(0) digital data bits at one or more boundaries between adjacent digital data bits. Details pertaining to the control circuit and the measurement node 107 are provided below. One or more of the other DAC cells can also incorporate a measurement node, and the measurement nodes of two or more DAC cells can be used to perform various types of measurements to evaluate the overall performance of the DAC 100 in various embodiments of the invention.

The current outputs IOUT(0) through IOUT(n−1) from the "n" DAC cells are combined in a combiner 135 that may include a summing amplifier, in order to produce an analog output signal of the DAC 100. The complementary current outputs IOUT(0)' through IOUT(n−1)' can be similarly combined in a combiner 140 when the DAC 100 is configured to operate in a differential mode of operation.

Figure 2:
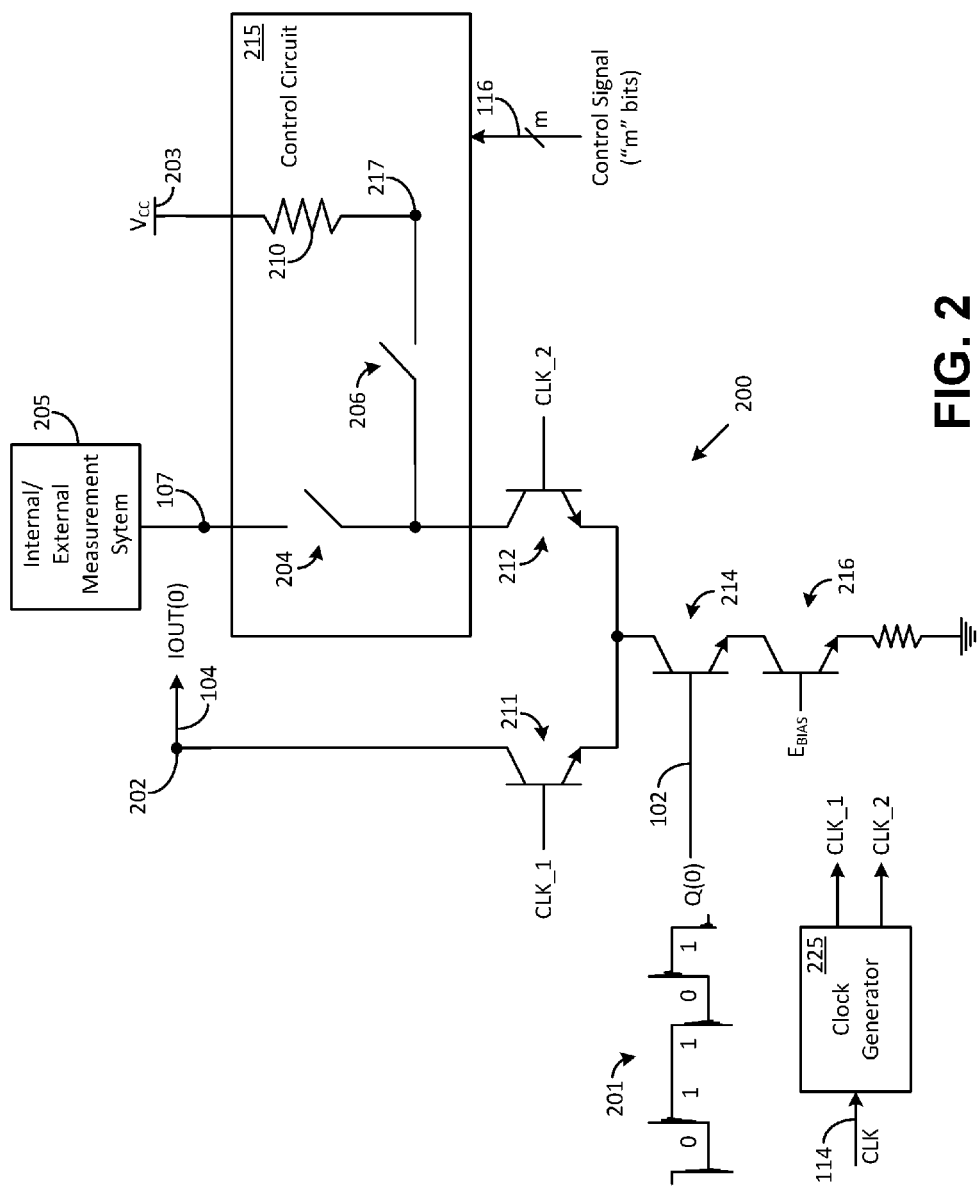
FIG. 2 illustrates a first circuit arrangement that can be included in a DAC cell in accordance with an exemplary embodiment of the present invention.

FIG. 2 illustrates a differential circuit 200 and a clock generator 225 that can be included in the DAC cell 110 that is a part of the DAC 100, in accordance with one exemplary embodiment of the invention. The transistors used in the differential circuit 200 may be of various types (bipolar transistors, field effect (FET) transistors, small signal transistor, high frequency transistors etc.). Consequently, any reference made to a base terminal, an emitter terminal, or a collector terminal with respect to the bipolar transistors shown in FIG. 2 should be interpreted equivalently for other types of transistors. Accordingly, a gate terminal of a FET can be interpreted as operating in a manner that is equivalent to a base terminal of a bipolar transistor, and a source terminal of the FET can be interpreted as operating in a manner that is equivalent to an emitter terminal of a bipolar transistor. It should also be understood that a larger number or a fewer number of transistors can be used (for various purposes) in addition to, or in lieu of, the ones shown in this example embodiment. Thus, in some implementations, additional transistors may be used in one or both branches of the differential circuit 200 for biasing purposes in addition to, or in lieu of, a biasing transistor 216 that is used for providing an $E_{BIAS}$ voltage in this exemplary embodiment.

The differential circuit 200 includes a trunk portion having a transistor 214 connected in series with the transistor 216. The differential circuit 200 further includes two branch portions that are linked to the trunk portion in a Y-configuration. One branch portion includes a transistor 211 and the other branch portion includes a transistor 212. Transistor 216 that is included in the trunk portion is configured as a biasing transistor (EBIAs applied to a base terminal of the transistor 216) that sets a current flow in the trunk portion. In some implementations, an amplitude of the current flow is set in accordance with a weighting parameter that influences an amplitude of the current output IOUT(0) coupled by the DAC cell 110 into the line 104. The transistor 214 can be a switching transistor that switches in response to the Q(0) signal provided by the D flip-flop 105 (shown in FIG. 1). The Q(0) signal typically includes a sequence of ones and zeros that correspond to the D(0) input into the DAC 100. The transistor 211 and the transistor 212 in the two branch portions are arranged to operate in a differential mode of operation and are controlled via a pair of clock signals (CLK_1 and CLK_2) that are provided by the clock generator 225. The clock generator 225 can generate these two clock signals by using the CLK signal provided via line 114 (shown in FIG. 1).

The branch portion that includes the transistor 211 has a node 202 connected to a collector terminal of the transistor 211. The current output IOUT(0) is coupled from the node 202 to the line 104. The branch portion that includes the transistor 212 is coupled to an exemplary control circuit 215. The exemplary control circuit 215 includes a switch 204 that is operable to selectively couple a collector terminal of the transistor 212 to the measurement node 107. A measurement system 205 can be coupled to the measurement node 107 for observing/evaluating any signal that is present at the collector terminal of the transistor 212. When the DAC 100 is implemented in an integrated circuit, a portion of the measurement system 205, or the entirety of the measurement system 205, are included inside the integrated circuit in one embodiment. In another embodiment, a portion of the measurement system 205, or the entirety of the measurement system 205, is provided in an element located external to the DAC 100, and can be coupled to the measurement node 107 via a pin of the integrated circuit.

The exemplary control circuit 215 further includes a switch 206 that is configured to operate in a complementary mode with respect to switch 204, such that switch 206 is placed in a closed state when switch 204 is placed in an open state, and vice-versa. The switch 204 and the switch 206 are operable under control of the "m" bit control signals. In this example configuration, where only two switches are used, "m"=1, and a single control signal line can be provided to carry a one bit control signal. The switch 204 and the switch 206 can be provided in various forms. For example, when the DAC 100 is embodied in an integrated circuit, the switch 204 and the switch 206 can be solid-state switches. On the other hand, when the DAC 100 is embodied on a printed circuit board, the switch 204 and the switch 206 can be either solid state switches or metallic switches such as relays.

When placed in a closed state, switch 206 couples a pull-up resistor 210 into the first branch of the differential circuit 200, specifically into the collector terminal of the transistor 212. The switch 206 is operable to be placed in this closed state by configuring the control signal to indicate a first action (for example, by placing the control signal to a logic "1" level) and is operable to be placed in an open state by configuring the control signal to indicate a second action (for example, by placing the control signal to a logic "0" level). When placed in the open state, switch 206 uncouples the pull-up resistor 210 from the first branch of the differential circuit 200, specifically from the collector terminal of the transistor 212. The first action places the DAC cell 110 in a mode of operation where no measurements are being carried out, for example by using the measurement system 205. At this time, portions of the input signal (Q(0)) that can have transitioning edges are discarded by the differential circuit 200 as a result of being coupled into the pull-up resistor 210 and routed to AC ground (i.e., to a voltage supply node 203 used to provide the pull-up function). Routing these portions to AC ground ensures that the current output IOUT(0) from node 202 is not adversely affected by perturbances that may be present in these portions of the input signal (Q(0)).

When switch 206 is placed in an open state and switch 204 placed in a closed state, portions of the input signal (Q(0)) can include a region that straddles a boundary between a first digital data bit and a second digital data bit are disconnected from the node 217 and connected to the measurement node 107 instead. One or more of the boundaries can include a transitioning edge when the second digital data bit is at a logic level that is different than a logic level of the first digital data bit. The transitioning edge can include transients in some cases. The switch 204 can be placed in the closed state by configuring the control signal to indicate a second action (for example, by placing the one bit control signal to a logic "0" level).

In an alternative embodiment in accordance with the invention, the switch 204 can be operated independently with respect to the switch 206 by using separate control signal lines for each switch. In this alternative embodiment, both switch 204 and switch 206 can be placed in a closed condition for example, so as to allow the measurement system 205 to evaluate one or more signals present at the measurement node 107 when the collector of the transistor 212 remains coupled to the node 217.

Figure 3:
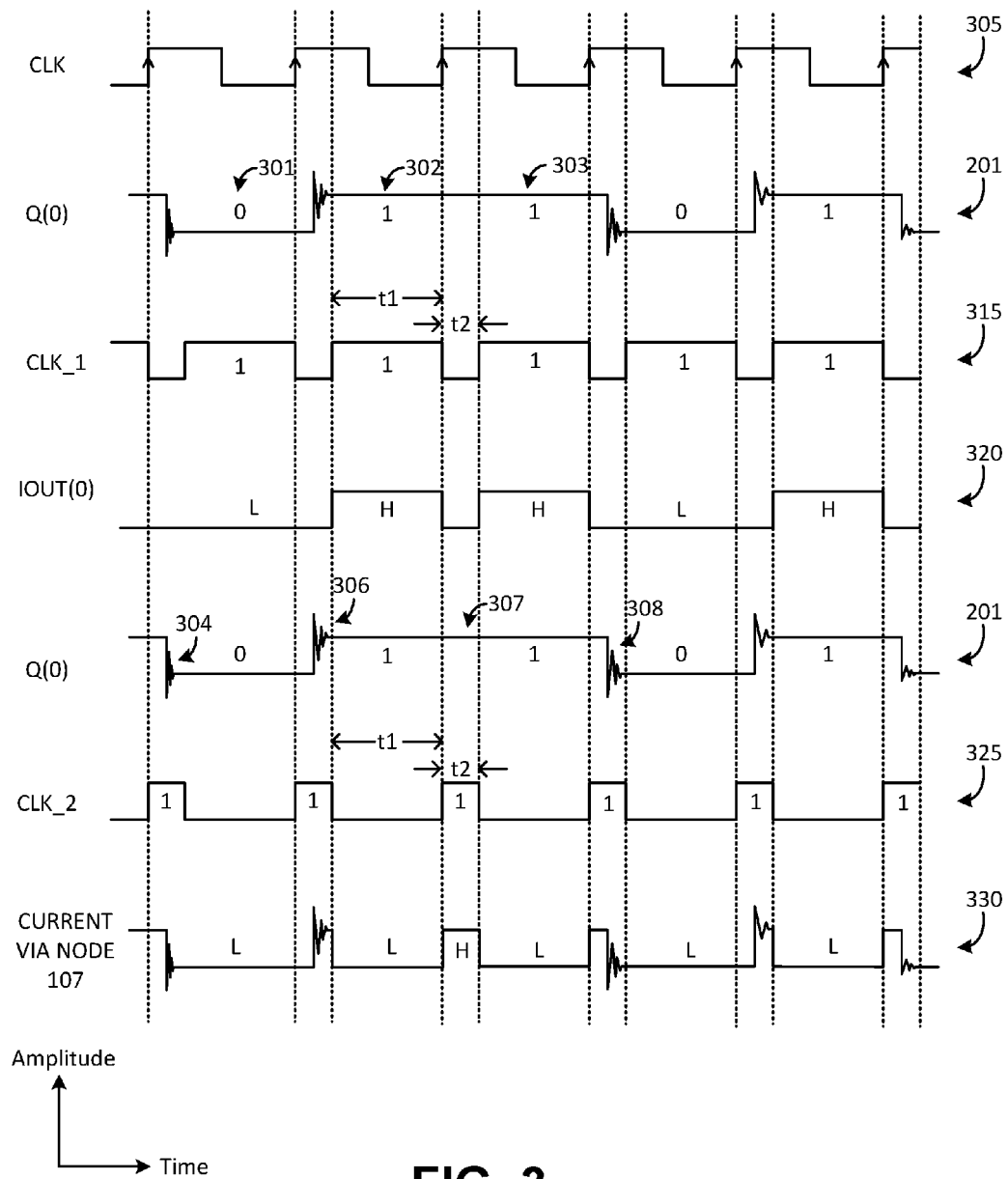
FIG. 3 illustrates some waveforms associated with the first circuit arrangement shown in FIG. 2.

The operation of the differential circuit 200 will now be described using FIG. 3, which illustrates some waveforms associated with the differential circuit 200. Waveform 305 corresponds to the clock (CLK) that is provided to the clock generator 225 via line 114. Waveform 201, which includes a sequence of ones and zeros, represents the Q(0) signal fed into the base of the transistor 214 in the form of a sequence of digital data bits by the D flip-flop 105 shown in FIG. 1. Waveform 315 represents the clock signal (CLK_1) provided by the clock generator 225 to a base terminal of transistor 211. Attention is drawn to a duty cycle of the waveform 315 that can have logic "1" levels extending over a period of time "t1" and logic "0" levels extending over a period of time "t2." Waveform 320 represents the current output IOUT(0) from node 202 into line 104 for propagation to combiner 135. Waveform 320, which represents current amplitudes of the current output IOUT(0), transitions to a high current amplitude (indicated by a "H") when each of waveform 201 (the Q(0) signal) and waveform 315 (CLK_1) is at a logic "1" level and transitions to a low current amplitude (indicated by a "L") for all other combinations of logic levels of the waveform 201 and the waveform 315.

In accordance with an embodiment of the invention, the duty cycle of the waveform 315, particularly with respect to the times at which portions of the waveform 315 correspond to the time periods "t1" and "t2," is selected to influence the waveform 320 (IOUT(0)). The portions of the waveform 315 that correspond to the time period "t1" are selected to coincide with a portion of the waveform 201 that has a substantially constant amplitude with no transitions. For example, a first occurrence of the time period "t1" of the waveform 315 coincides with a steady state amplitude that is substantially constant and corresponds to a logic "0" state 301 of the waveform 201, a second occurrence of the time period "t1" of the waveform 315 coincides with a steady state amplitude that is substantially constant and corresponds to a logic "1" state 302 of the waveform 201, a third occurrence of the time period "t1" of the waveform 315 coincides with a steady state amplitude that is substantially constant and corresponds to a logic "1" state 303 of the waveform 201, and so on. The timing arrangement of the time periods "t1" in the waveform 315 with respect to the waveform 201 ensures that the waveform 320 (IOUT(0)) contains no transients associated with the transitioning edges of the waveform 201. Referring back to FIG. 1, it can be understood that the differential circuit 200 of the DAC cell 110 thus operates to prevent transients that may be present in the Q(0) output of the D flip-flop 105 from appearing on the current output IOUT(0) provided by the DAC cell 110 to the combiner 135.

A waveform 325 represents the clock signal (CLK_2) provided by the clock generator 225 to a base terminal of transistor 212. In this exemplary embodiment, waveform 325 is complementary to waveform 315, which represents the clock signal (CLK_1) provided by the clock generator 225 to the base terminal of transistor 211. As a result of this timing arrangement, the amplitude of the waveform 325 during the time periods "t1" corresponds to a logic "0" level and during the time periods "t2" corresponds to a logic "1" level. Waveform 330 represents current amplitudes at the measurement node 107 that can be used for evaluation by the measurement system 205. Waveform 330 transitions to a high current amplitude (indicated by a "H") exclusively when each of waveform 201 (the Q(0) signal) and waveform 325 (CLK_2) is at a logic "1" level and transitions to a low current amplitude (indicated by a "L") for all other combinations of logic levels of the waveform 201 and the waveform 325.

The portions of the waveform 325 that correspond to the time period "t2" are selected to coincide with portions of the waveform 201 that encompass a boundary between any two adjacent digital bits. One or more of these boundaries can encompass a transitioning edge when the two adjacent bits have different logic levels. Transitioning edges, especially fast transitioning edges, typically lead to transients in the form of overshoots and undershoots as is known by persons of ordinary skill in the art. A first occurrence of the time period "t2" of the waveform 325 encompasses a first boundary 304 (that includes a transitioning edge) in the waveform 201, a second occurrence of the time period "t2" of the waveform 325 encompasses a second boundary 306 (that includes a transitioning edge) in the waveform 201, a third occurrence of the time period "t2" of the waveform 325 encompasses a third boundary 307 (that does not include a transitioning edge) in the waveform 201, and a fourth occurrence of the time period "t2" of the waveform 325 encompasses a fourth boundary 308 (that includes a transitioning edge) in the waveform 201, and so on.

In this exemplary embodiment, the non-return to zero (NRZ) nature of the waveform 201 precludes a transitioning edge from occurring at the third boundary 307 in the waveform 201. As can be understood, a transitioning edge will be present at the third boundary 307 when the waveform 201 is a return-to-zero (RZ) waveform.

The timing duration of the time periods "t2" in the waveform 325 can be selected to encompass a logic level portion of a first bit located on one side of the boundary and a logic level portion of an adjacent second bit located on the other side of the boundary. The duration and time of occurrence of each of the time periods "t2" in the waveform 325 can be selected in accordance with various measurement-related criteria such as for example, a priori knowledge of the nature of the transients. For example, using a first measurement-related criterion (based on expecting short duration transients, for example), the time period "t2" can be selected so as to encompass a transitioning edge (a boundary between two adjacent digital data bits), a portion of a logic level preceding the transitioning edge, and a portion of a logic level following the transitioning edge. Including portions of the logic levels that precede and succeed the transitioning edge, results in the waveform 330 having an average DC level that can be adjusted based on the portions of logic levels that are included.

Using a second measurement-related criterion (based on expecting longer duration transients, for example), the time period "t2" can be selected so as to have a width that solely encompass a transitioning edge and omits a logic level preceding the transitioning edge as well as a logic level following the transitioning edge. Excluding portions of the logic levels results in the waveform 330 providing more information vis-à-vis the AC aspects associated with the transients. It should be understood that the waveform 315 and the waveform 325 described in this example embodiment are indicated as having a duty cycle other than a fifty-percent duty cycle. However, in some other embodiments, one or both of the waveform 315 and the waveform 325 can have a fifty-percent duty cycle.

More particularly, the waveform 315 that is coupled into the transistor 211 has a waveshape that prevents propagation of current through the branch in which the transistor 211 is located when the transistor 214 receives the "t2" portions of the waveform 201 (the Q(0) signal) and allows propagation of current through the branch in which the transistor 211 is located when the transistor 214 receives the "t1" portions of the waveform 201. Correspondingly, the waveform 325 that is coupled into the transistor 212 has a waveshape that permits propagation of current through the branch in which the transistor 212 is located when the transistor 214 receives the "t2" portions of the waveform 201 (the Q(0) signal) and prevents propagation of current through the branch in which the transistor 212 is located when the transistor 214 receives the "t1" portions of the waveform 201.

Figure 4:
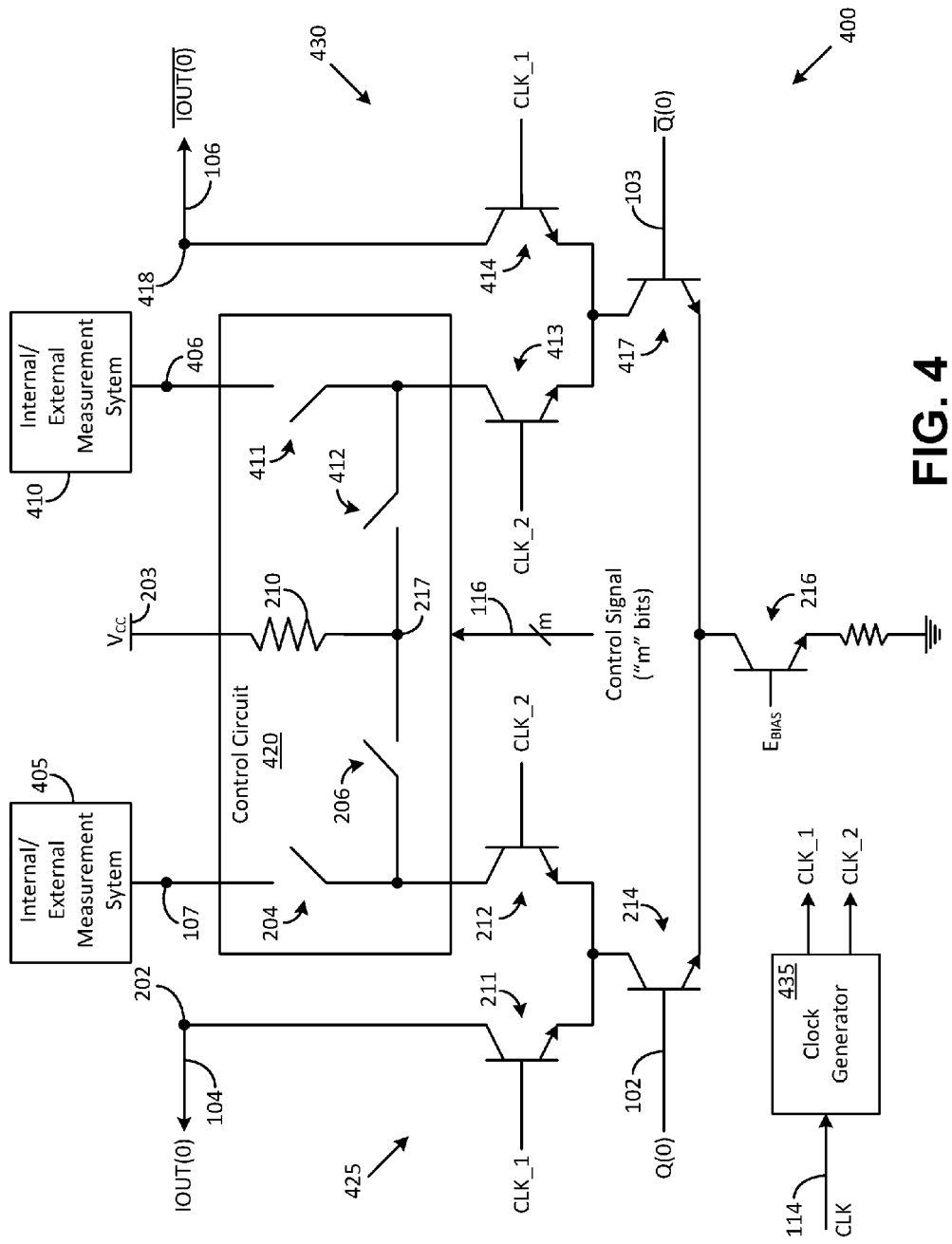
FIG. 4 illustrates a second circuit arrangement that can be included in a DAC cell in accordance with another exemplary embodiment of the present invention.

FIG. 4 illustrates a second circuit arrangement 400 that can be included in the DAC cell 110 that is a part of the DAC 100 in accordance with another exemplary embodiment of the invention. The second circuit arrangement 400, which includes a first differential circuit 425, a second differential circuit 430, and a clock generator 435, provides a current output IOUT(0) and another current output IOUT(0)'. The first differential circuit 425 in the pair of differential circuits is similar to the differential circuit 200 described above. The second differential circuit 430 can be viewed as a mirrored copy of the first differential circuit 425. Accordingly, the clock signal CLK_1 is coupled into the base terminal of transistor 211 as well as transistor 414 and the clock signal CLK_2 is coupled into the base terminal of transistor 212 as well as transistor 413. The Q(0) signal is coupled into the base terminal of transistor 214 and the Q(0)' signal is coupled into the base terminal of transistor 417. Transistor 216, which is included in the trunk portion of the pair of differential circuits (425 and 430), is configured as a biasing transistor by application of an $E_{BIAS}$ voltage to a base terminal.

The control circuit 420 includes the switch 204 and the switch 206, and further includes a switch 411 and a switch 412. In one exemplary implementation, the control signal provided to the control circuit 420 can be propagated through a single control line (m=1) that can be placed at a first logic level in order to activate a first pair of switches (the switch 204 and the switch 411, for example), and can be placed at an opposing logic level in order to activate a second pair of switches (the switch 206 and the switch 412, for example). In another exemplary implementation, the control signal provided to the control circuit 420 can be propagated through two control lines (m=2). When two control lines are used, one control line can be used for example to provide control logic to place the switch 204 and the switch 206 in opposing states (one closed and the other open). The other control line can be used for example to provide control logic to place the switch 411 and the switch 412 in opposing states (one closed and the other open). The two control lines allow for four different combination of switch activations. It can be understood that one of these combinations can be used to place both switch 204 and switch 206 in an identical switched state (both open or both closed), and another combination can be used to place both switch 411 and switch 412 in an identical switched state (both open or both closed).

Each of measurement system 405 coupled to the measurement node 107 and measurement system 410 coupled to a measurement node 406, can be partially or fully integrated into a package (an integrated circuit, for example) or can be fully external to the package. Furthermore, one of the measurement system 405 and the measurement system 410 can be omitted in some implementations, and a single measurement system can be used to evaluate one or more signals present on either measurement node 107 or on measurement node 406. Attention is drawn to the collector terminal of transistor 414, which includes an output node 418 that is coupled to line 106 and propagates the current output IOUT(0)' to the combiner 140 (shown in FIG. 1).

Figure 5:
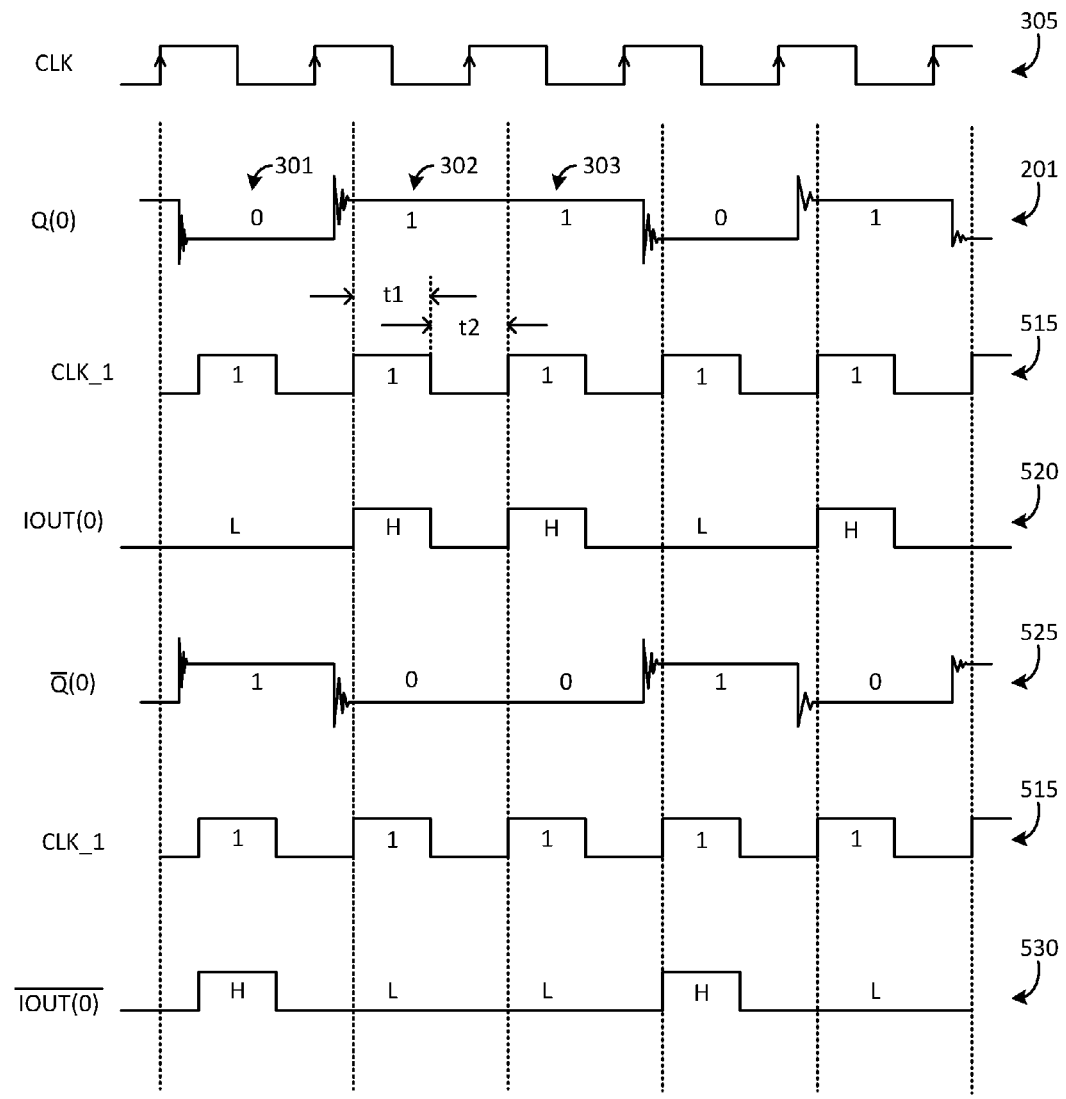
FIG. 5 illustrates a first set of waveforms associated with the second circuit arrangement shown in FIG. 4.

Attention is next drawn to FIG. 5, which illustrates a first set of waveforms associated with the second circuit arrangement 400 shown in FIG. 4. Waveform 305 corresponds to the clock (CLK) that is provided to the clock generator 435 via line 114. Waveform 201, which includes a sequence of ones and zeros, represents the Q(0) signal fed into the base of the transistor 214 in the form of a sequence of digital data bits by the D flip-flop 105 shown in FIG. 1. Waveform 515 represents the clock signal (CLK_1) provided by the clock generator 435 to the base terminal of transistor 211 and the base terminal of transistor 414. In this example embodiment, waveform 515 has a 50% duty cycle. However, in other embodiments, waveform 515 can have other duty cycles. Waveform 520, which represents current amplitudes of the current output IOUT(0), transitions to a high current amplitude (indicated by a "H") when each of waveform 201 (the Q(0) signal) and waveform 515 (CLK_1) is at a logic "1" level and transitions to a low current amplitude (indicated by a "L") for all other combinations of logic levels of the waveform 201 and the waveform 515.

Waveform 525 represents the Q(0)' signal (corresponding to the complementary Q(0)' output of the D flip-flop 105) that includes a sequence of ones and zeros. The Q(0)' signal is coupled into the base terminal of transistor 417. Waveform 515 represents the clock signal (CLK_1) provided by the clock generator 435 to the base terminal of transistor 211 and the base terminal of transistor 414. Waveform 530, which represents current amplitudes of the current output IOUT (0)', transitions to a high current amplitude (indicated by a "H") when each of waveform 525 (the Q(0)' signal) and waveform 515 (CLK_1) is at a logic "1" level and transitions to a low current amplitude (indicated by a "L") for all other combinations of logic levels of the waveform 525 and the waveform 515.

Figure 6:
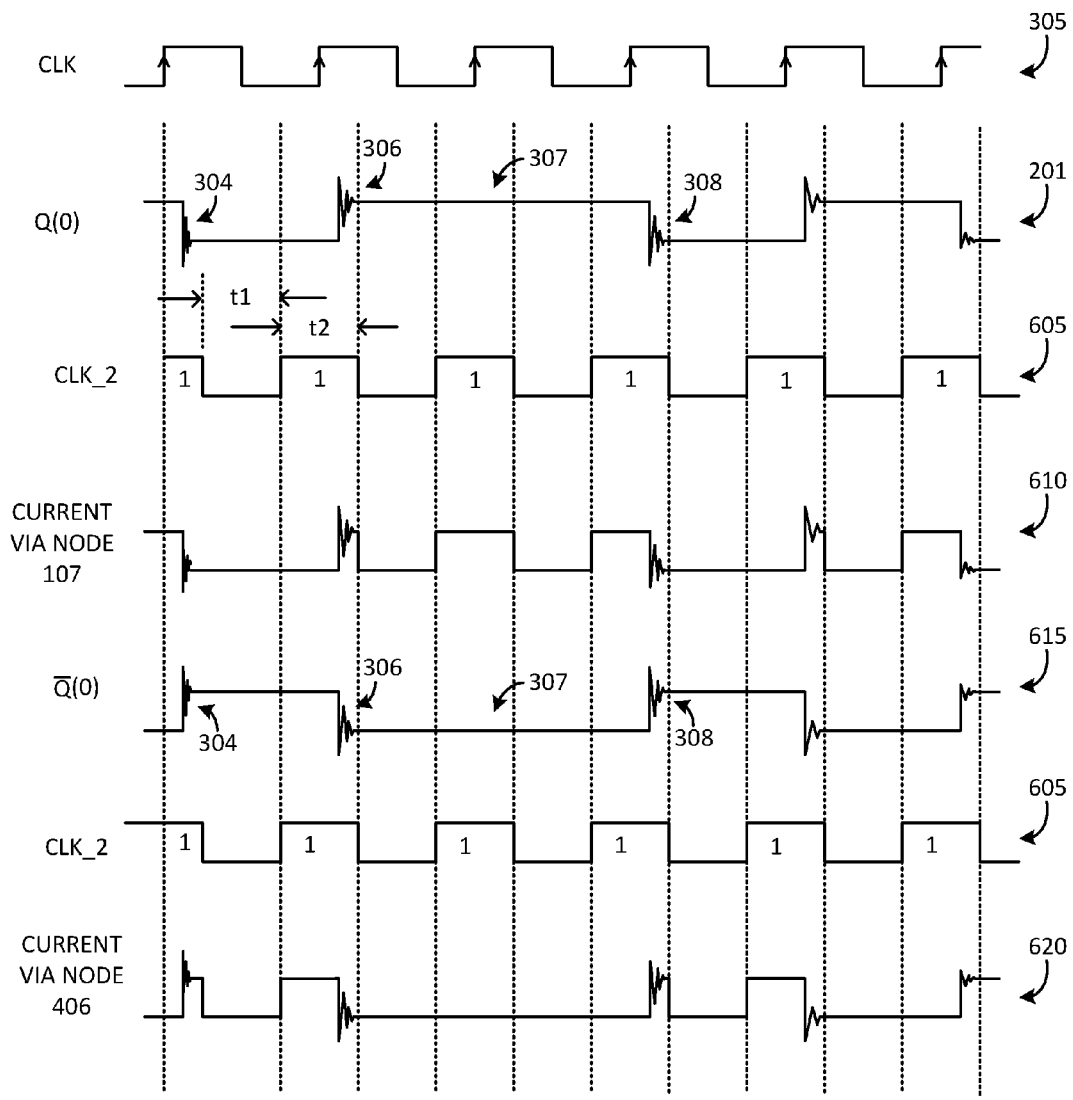
FIG. 6 illustrates a second set of waveforms associated with the second differential circuit shown in FIG. 4.

Attention is next drawn to FIG. 6, which illustrates a second set of waveforms associated with the second circuit arrangement 400 shown in FIG. 4. Waveform 305 corresponds to the clock (CLK) that is provided to the clock generator 435 via line 114. Waveform 201, which includes a sequence of ones and zeros, represents the Q(0) signal fed into the base of the transistor 214 in the form of a sequence of digital data bits by the D flip-flop 105 shown in FIG. 1. Waveform 605 represents the clock signal (CLK_2) provided by the clock generator 435 to the base terminal of transistor 212 and the base terminal of transistor 413. In this example embodiment, waveform 605 has a 50% duty cycle and is complementary in phase with the clock signal (CLK_1) waveform 515 shown in FIG. 5. However, in other embodiments, the clock signal (CLK_2) waveform 605 can have other duty cycles and can be phase shifted to various extents with respect to the clock (CLK) waveform 305 and/or the clock signal (CLK_1).

Waveform 610 represents current amplitudes at the measurement node 107 that can be used for evaluation by the measurement system 405. Waveform 610 transitions to a high current amplitude (indicated by a "H") exclusively when each of waveform 201 (the Q(0) signal) and waveform 605 (CLK_2) is at a logic "1" level and transitions to a low current amplitude (indicated by a "L") for all other combinations of logic levels of the waveform 201 and the waveform 605.

The portions of the waveform 605 that correspond to the time period "t2" are selected to coincide with portions of the waveform 201 that straddle a boundary between any two adjacent digital bits. One or more of these boundaries can encompass a transitioning edge when the two adjacent bits have different logic levels. A first occurrence of the time period "t2" of the waveform 605 encompasses a first boundary 304 (that includes a transitioning edge) in the waveform 201, a second occurrence of the time period "t2" of the waveform 605 encompasses a second boundary 306 (that includes a transitioning edge) in the waveform 201, a third occurrence of the time period "t2" of the waveform 605 encompasses a third boundary 307 (that does not include a transitioning edge) in the waveform 201, and a fourth occurrence of the time period "t2" of the waveform 605 encompasses a fourth boundary 308 (that includes a transitioning edge) in the waveform 201, and so on.

In this exemplary embodiment, the non-return to zero (NRZ) nature of the waveform 201 precludes a transitioning edge from occurring at the third boundary 307 in the waveform 201. As can be understood, a transitioning edge will be present at the third boundary 307 when the waveform 201 is a return-to-zero (RZ) waveform.

The timing duration of the time periods "t2" in the waveform 605 can be selected to encompass a logic level portion of a first bit located on one side of the boundary and a logic level portion of an adjacent bit located on the other side of the boundary. The duration and time of occurrence of each of the time periods "t2" in the waveform 605 can be selected in accordance with various measurement-related criteria such as for example, a priori knowledge of the nature of the transients. For example, using a first measurement-related criterion (based on expecting short duration transients, for example), the time period "t2" can be selected so as to encompass a transitioning edge (a boundary between two adjacent digital data bits), a portion of a logic level preceding the transitioning edge, and a portion of a logic level following the transitioning edge. Including portions of the logic levels that precede and succeed the transitioning edge, results in the waveform 610 having an average DC level that can be adjusted based on the portions of logic levels that are included.

Using a second measurement-related criterion (based on expecting longer duration transients, for example), the time period "t2" can be selected so as to have a width that solely encompass a transitioning edge and omits a logic level preceding the transitioning edge as well as a logic level following the transitioning edge. Excluding portions of the logic levels results in the waveform 610 providing more information vis-à-vis the AC aspects associated with the transients.

Waveform 620 represents current amplitudes at the measurement node 406 that can be used for evaluation by the measurement system 410. Waveform 620 transitions to a high current amplitude (indicated by a "H") when each of waveform 615 (the Q(0)' signal) and waveform 605 (CLK_2) is at a logic "1" level and transitions to a low current amplitude (indicated by a "L") for all other combinations of logic levels of the waveform 201 and the waveform 615. The transitioning edges of the waveform 615 (the Q(0)' signal) are complementary to the transitioning edges of the waveform 201 (the Q(0) signal) and the manner in which the waveform 620 is obtained can be understood in view of the description above.

Figure 7:
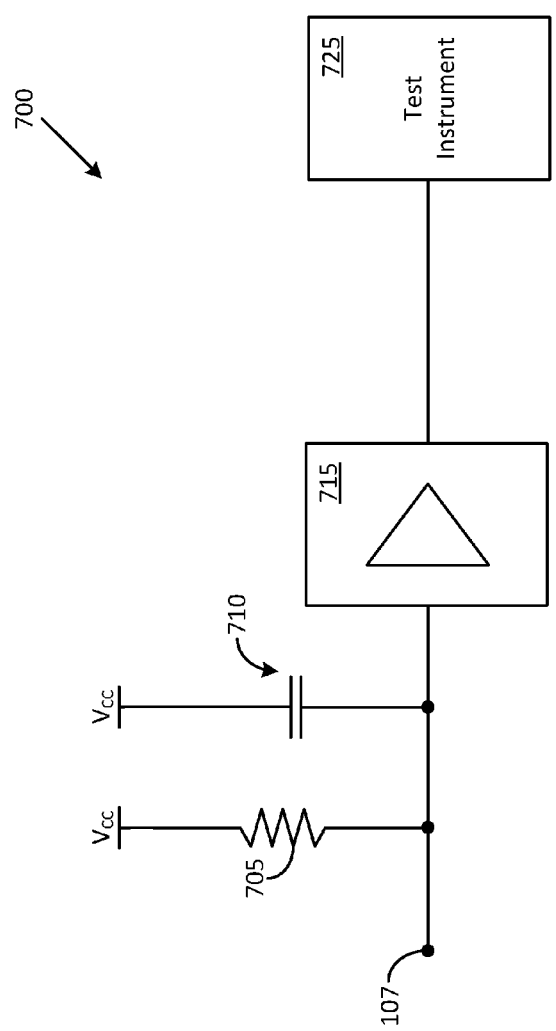
FIG. 7 illustrates a first exemplary implementation of a measurement system in accordance with an embodiment of the present invention.

FIG. 7 illustrates a first exemplary implementation of a measurement system 700 in accordance with the invention. The measurement system 700 (as well as the other measurement systems described below) can represent any one of the measurement system 205, the measurement system 405, or the measurement system 410. Measurement system 700 can be coupled to the measurement node 107 that is shown in FIG. 2 (or to the measurement node 406 shown in FIG. 4) and includes an R-C filter in the form of a pull-up resistor 705 and a capacitor 710. The capacitor 710 can be connected to either a power supply or to a ground node. The values of the pull-up resistor 705 and the capacitor 710 can be selected in accordance with a desired level of filtering to be applied to the current at the measurement node 107 (waveform 330 shown in FIG. 3 or waveform 610 shown in FIG. 6) in order to obtain a filtered signal. The filtered signal, which can have an average DC level in addition to fluctuations attributable to the transients, is indicative of the characteristics of the transients present in the portion of the Q(0) waveform that is associated with current flow in the branch circuit containing the transistor 212 (FIG. 2). The filtered waveform can be buffered/amplified by an amplifier circuit 715 that can be incorporated into the same package as the DAC 100 (an integrated circuit, for example) in some implementations. The buffered/amplified waveform can be evaluated using a test instrument 725 such as an oscilloscope or a voltmeter.

Figure 8:
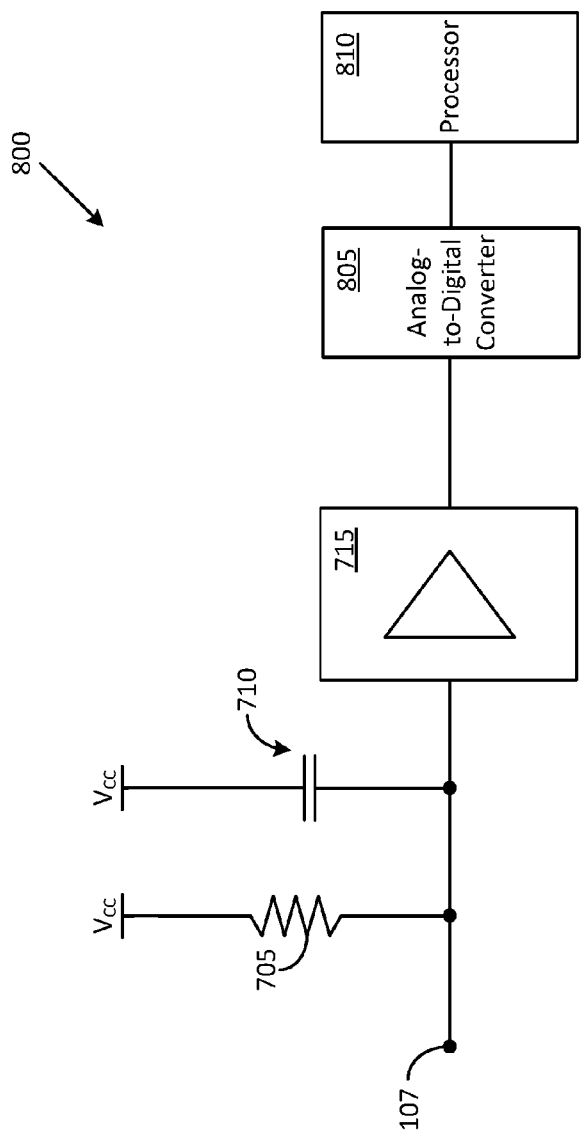
FIG. 8 illustrates a second exemplary implementation of a measurement system in accordance with an embodiment of the present invention.

FIG. 8 illustrates a second exemplary implementation of a measurement system 800 in accordance with the disclosure. In this implementation, the buffered/amplified waveform output by the amplifier circuit 715 can be digitized using an analog-to-digital converter (ADC) 805. The ADC 805 can also be incorporated into the same package as the DAC 100 (an integrated circuit, for example) in some implementations. The digital signal output of the ADC 805 can be provided to a processor 810 for processing. The processor 810 can be a digital signal processor (DSP), a general-purpose processor circuit, or a computer (a personal computer or a special purpose computer) in various implementations.

Figure 9:
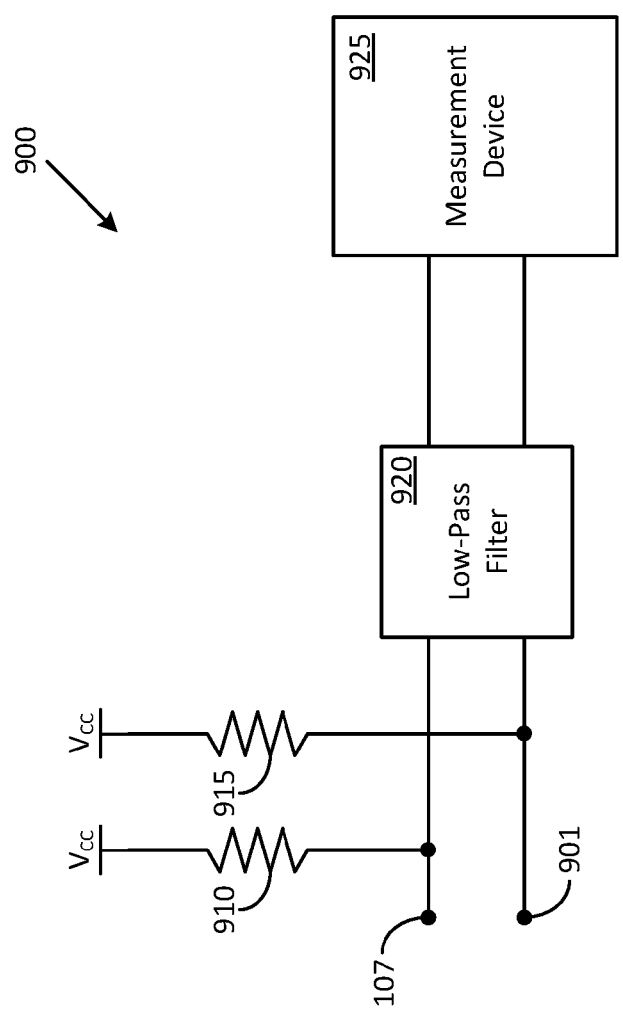
FIG. 9 illustrates a third exemplary implementation of a measurement system in accordance with an embodiment of the present invention.

FIG. 9 illustrates a third exemplary implementation of a measurement system 900 in accordance with the invention. Measurement system 900 is configured to receive a pair of current output, such as the current at the measurement node 107 and another current at a measurement node 901 of a DAC cell other than DAC cell 110 (or at the measurement node 406 of the DAC cell 110). Measurement node 107 is coupled to a pull-up resistor 910 and a low-pass filter 920. Measurement node 901 is coupled to a pull-up resistor 915 and the low-pass filter 920. The low-pass filter 920 can be implemented in many different ways in accordance with a desired level of filtering to be applied to one or both of the currents. One or both of the filtered signals can be evaluated using a measurement device 925 such as a 2-channel oscilloscope or a voltmeter.

The measurement device 925 can be used to evaluate each of the currents individually and/or to compare the two currents. Comparing the two currents can provide an indication of various types of errors that can exist between DAC cell 110 and the other DAC cell in the DAC 100. These errors can include for example, a current source error (such as in the current source formed in part by transistor 216 shown in FIG. 2), a current source mismatch error (between two or more current sources in the DAC 100), a clock duty cycle error, and/or a control signal switching error.

Figure 10:
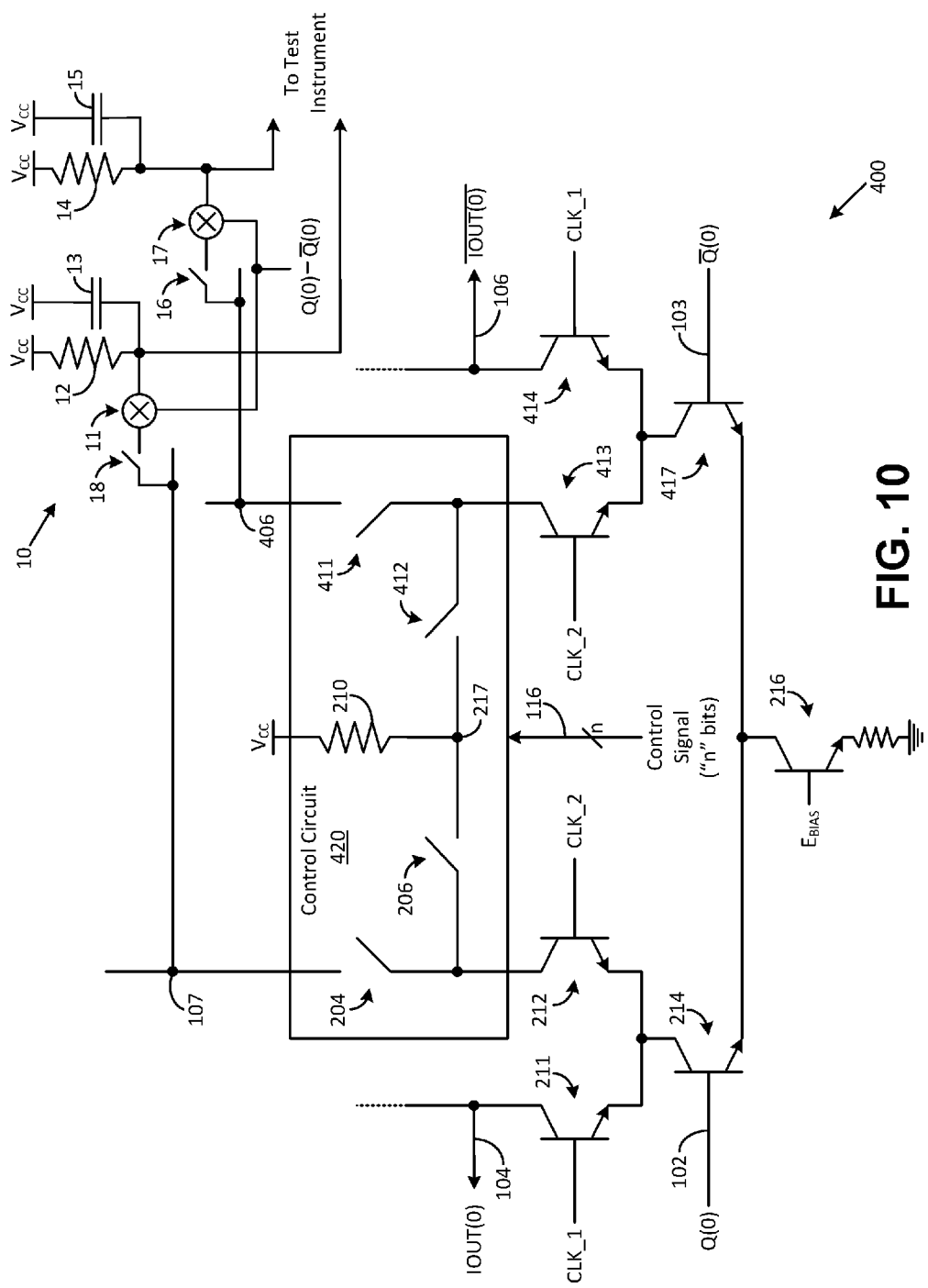
FIG. 10 illustrates a fourth exemplary implementation of a measurement system in accordance with an embodiment of the present invention.

FIG. 10 illustrates a fourth exemplary implementation of a measurement system 10 coupled to the second circuit arrangement 400 (shown in FIG. 4) in accordance with the disclosure. The measurement system 10 can represent a combination, at least in part, of the measurement system 405 and measurement system 410 shown in FIG. 4. Measurement system 10 is configured to receive a pair of currents, such as the current at the measurement node 107 of the DAC cell 110 and the current at the measurement node 406 of the DAC cell 110. This first arrangement allows for evaluation of various types of errors that may be present in and/or between the two currents in the DAC cell 110. Alternatively, the measurement system 10 can be configured to receive the current that is at the measurement node 107 of the DAC cell 110 and another current at a measurement node of a DAC cell other than DAC cell 110. This second arrangement allows for evaluation of various types of errors that may be present in and/or between a first sequence of digital data bits coupled into the DAC cell 110 and a second sequence of digital data bits coupled into the other DAC cell.

Measurement node 107 is coupled through a switch 18 to a first input of a multiplier 11. The switch 18 can be used to selectively couple the measurement node 107 to the multiplier 11. The output of the multiplier 11 is coupled to a resistor 12 and a capacitor 13, each of which is coupled to a supply voltage. The resistor 12 operates as a voltage sensing resistor element for sensing the current at the measurement node 107. The voltage across the voltage sensing resistor is made available to a test instrument such as a voltmeter or an oscilloscope. Measurement node 406 is coupled through a switch 16 to a first input of a multiplier 17. The switch 16 can be used to selectively couple the measurement node 406 to the multiplier 17. The output of the multiplier 17 is coupled to a resistor 14 and a capacitor 15, each of which is coupled to a supply voltage. The resistor 14 operates as a voltage sensing resistor element for sensing the current from measurement node 40. The voltage across the voltage sensing resistor 14 is made available to the test instrument as well. A second input of each of the multiplier 11 and the multiplier 17 is provided with a signal (Q(0)-Q(0)') that represents a difference between the Q(0) signal coupled into the base of the transistor 214 and the Q(0)' signal coupled into the base of the transistor 417. This arrangement provides a correlation operation that can be used to evaluate various types of errors in the DAC 100. The test instrument can be used to evaluate the extent of these errors and can be particularly useful for evaluating code-dependent errors.

Figure 11:
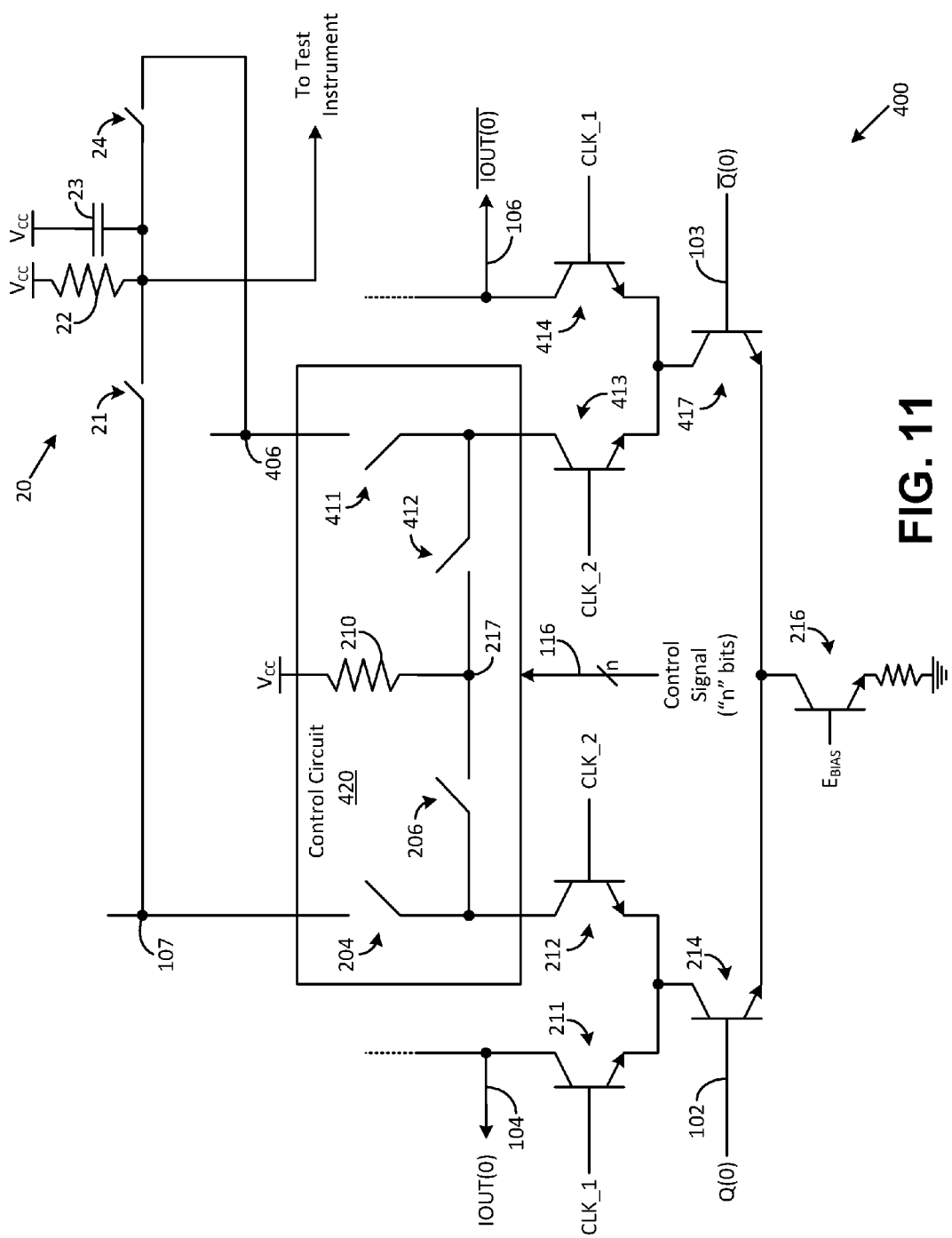
FIG. 11 illustrates a fifth exemplary implementation of a measurement system in accordance with an embodiment of the present invention.

FIG. 11 illustrates a fifth exemplary implementation of a measurement system 20 coupled to the second circuit arrangement 400 (shown in FIG. 4) in accordance with the invention. The measurement system 20 can represent a combination, at least in part, of the measurement system 405 and measurement system 410 shown in FIG. 4. Measurement system 20 is configured to receive a pair of currents, such as the current at the measurement node 107 of the DAC cell 110 and the current at the measurement node 406 of the DAC cell 110. This first arrangement allows for evaluation of various types of errors that may be present in and/or between the two currents. Alternatively, the measurement system 20 can be configured to receive the current from the measurement node 107 of the DAC cell 110 and another current from a measurement node of a DAC cell other than DAC cell 110. This second arrangement allows for evaluation of various types of errors, such as current source mismatch errors and clock duty cycle errors that may be present in DAC cell 110 and the other DAC cell, individually or with respect to each other.

Measurement node 107 is coupled through a switch 21 to a resistor 22 and a capacitor 23, each of which is coupled to a power supply. The resistor 22 operates as a voltage sensing resistor element for measuring the current by providing a voltage drop that is made available to a test instrument such as a voltmeter or an oscilloscope. Measurement node 406 is coupled through a switch 24 to the resistor 22 and the capacitor 23 as well. The test instrument can be used for example, to measure a mismatch between the current source (provided in part by transistor 216) in the second circuit arrangement 400 that is a part of the DAC cell 110 and a current source in the other DAC cell. The mismatch measurement can be carried out by closing both switch 21 and switch 24 in order to measure a voltage drop across the resistor 22 as a result of the current source provided by transistor 216 (or the current source in the other DAC cell). The switch 21 and switch 24 can be operated in several other ways to carry out several other types of measurements.

Figure 12:
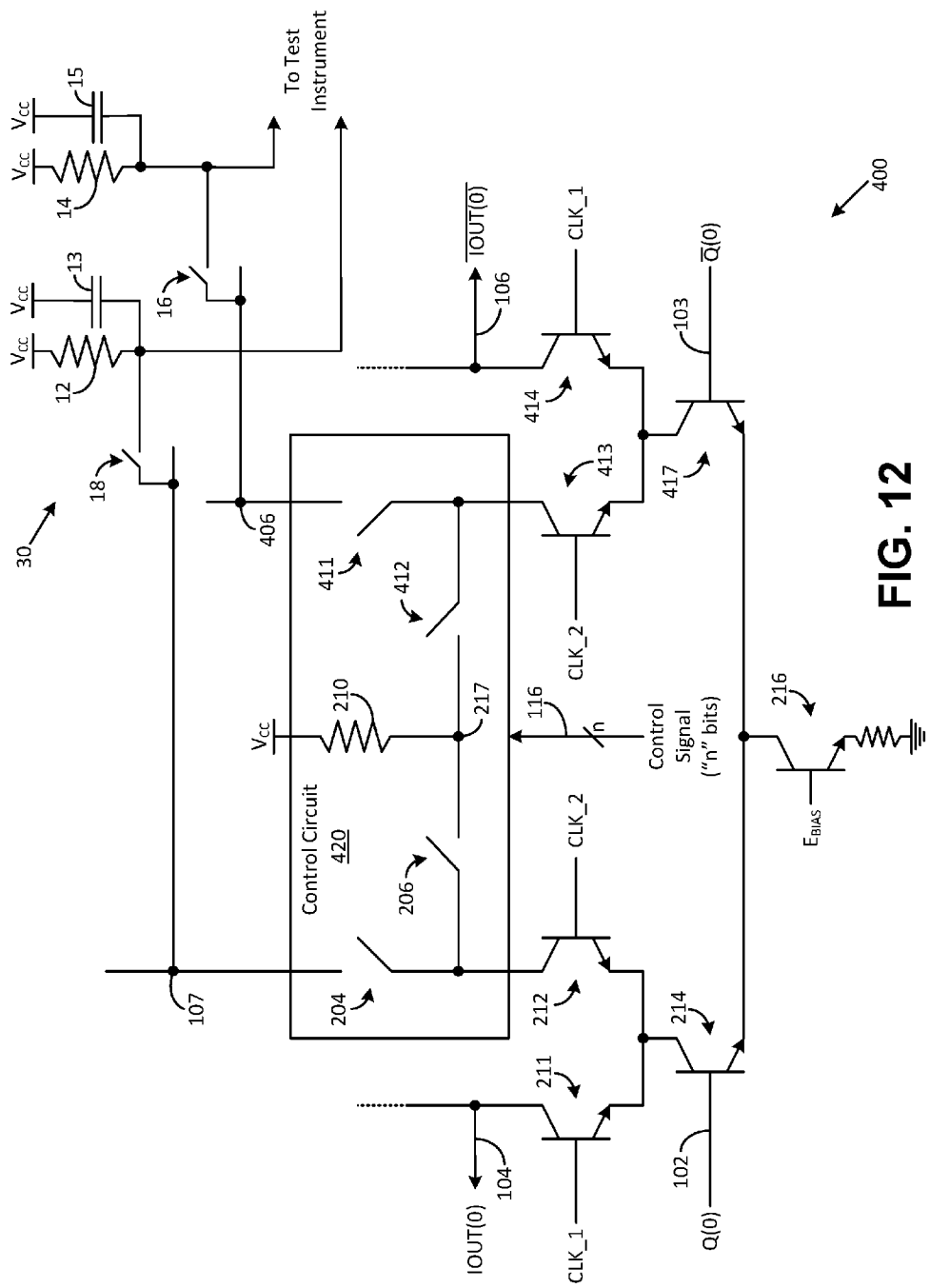
FIG. 12 illustrates a sixth exemplary implementation of a measurement system in accordance with an embodiment of the present invention.

FIG. 12 illustrates a sixth exemplary implementation of a measurement system 30 coupled to the second circuit arrangement 400 (shown in FIG. 4) in accordance with the invention. Measurement system 30, which resembles the measurement system 10 shown in FIG. 10 but omits the multiplier 11 and the multiplier 17, can be used to estimate switching errors in the various transistors, such is in one or both of the transistor 211 and transistor 212 that constitute one differential circuit, and/or in one or both of the transistor 413 and transistor 414 that constitute another differential circuit.

In summary, it should be noted that the invention has been described with reference to a few illustrative embodiments for the purpose of demonstrating the principles and concepts of the invention. It will be understood by persons of skill in the art, in view of the description provided herein, that the invention is not limited to these illustrative embodiments. Persons of skill in the art will understand that many such variations can be made to the illustrative embodiments without deviating from the scope of the invention.

The invention claimed is:

1. A digital-to-analog converter comprising:
 a first digital-to-analog converter cell configured to receive a control signal and a sequence of digital data bits, the sequence of digital data bits comprising a first digital data bit followed by a second digital data bit, the first digital-to-analog converter cell comprising a differential circuit configured to operate upon the sequence of digital data bits by discarding a first portion of the sequence of digital data bits when the control signal indicates a first action, and coupling the first portion of the sequence of digital data bits into a measurement node when the control signal indicates a second action, the first portion of the sequence of digital data bits encompassing a region that straddles a boundary between the first digital data bit and the second digital data bit.

2. The digital-to-analog converter of claim 1, wherein the first digital-to-analog converter cell further comprises:
 a control circuit connected to a first branch of the differential circuit, the control circuit comprising a first switch, a second switch, and a first resistor that is connected to one of a power supply or a ground node, the first switch operable under control of the control signal to couple the first resistor into the first branch of the differential circuit when the control signal indicates the first action and to uncouple the first resistor from the first branch of the differential circuit when the control signal indicates the second action, the second switch operable under control of the control signal to couple the first portion of the sequence of digital data bits into the measurement node when the control signal indicates the second action.

3. The digital-to-analog converter of claim 2, further comprising:
a measurement system coupled to the measurement node for measuring one or more parameters of one or more transients when one or more transients occur at the boundary between the first digital data bit and the second digital data bit.

4. The digital-to-analog converter of claim 3, wherein the differential circuit comprises the first branch and a second branch, the first branch configured to propagate a first current exclusively in response to the first portion of the sequence of digital data bits and the second branch configured to propagate a second current exclusively in response to a second portion of the sequence of digital data bits, the second portion of the sequence of digital data bits encompassing a substantially constant amplitude portion of the first digital data bit.

5. The digital-to-analog converter of claim 4, wherein the measurement system is configured to propagate the first current through a second resistor and produce a voltage drop across the second resistor that is indicative of at least one type of error in the digital-to-analog converter.

6. The digital-to-analog converter of claim 5, wherein the at least one type of error comprises one or more of a current source error, a clock duty cycle error, a control signal switching error, or a code-dependent error in at least one of the first digital-to-analog converter cell or a second digital-to-analog converter cell.

7. A digital-to-analog converter comprising:
a digital-to-analog converter cell comprising:
a first transistor that is a part of a trunk section of a differential circuit, the first transistor configured to receive a sequence of digital data bits comprising a first digital data bit followed by a second digital data bit;
a second transistor that is a part of a first branch of the differential circuit, the second transistor configured to receive a first input signal that permits propagation of a first current through the first branch of the differential circuit only when the first transistor receives a first portion of the sequence of digital data bits, the first portion encompassing a boundary between the first digital data bit and the second digital data bit; and
a control circuit connected to the second transistor, the control circuit comprising one or more switches and a resistor that is connected to a first node, the control circuit configured to accept a control signal and route the first current via the first node when the control signal indicates a first action, and to route the first current via a measurement node when the control signal indicates a second action.

8. The digital-to-analog converter of claim 7, further comprising:
a third transistor that is a part of a second branch of the differential circuit, the third transistor configured to receive a second input signal that prevents propagation of a second current through the second branch when the first transistor receives the first portion of the sequence of digital data bits.

9. The digital-to-analog converter of claim 8, wherein the first input signal is a first clock signal and the second input signal is a second clock signal that is complementary to the first clock signal.

10. The digital-to-analog converter of claim 9, wherein the first clock signal has a duty cycle other than a fifty-percent duty cycle.

11. The digital-to-analog converter of claim 8, wherein each digital data bit in the sequence of digital data bits is a part of at least one of a byte or a word that is provided to the digital-to-analog converter.

12. The digital-to-analog converter of claim 8, wherein the first portion of the sequence of digital data bits includes a transitioning edge at the boundary between the first digital data bit and the second digital data bit.

13. The digital-to-analog converter of claim 8, further comprising:
a measurement system coupled to the measurement node for measuring one or more parameters of one or more transients when the one or more transients occur at the boundary between the first digital data bit and the second digital data bit.

14. A method comprising:
providing a digital-to-analog converter comprising a digital-to-analog converter cell;
receiving a control signal and a sequence of digital data bits in the digital-to-analog converter cell, the sequence of digital data bits comprising a first digital data bit followed by a second digital data bit;
coupling the sequence of digital data bits into a differential circuit that is part of the digital-to-analog converter cell; and
using the differential circuit to discard a first portion of the sequence of digital data bits when the control signal indicates a first action and to couple the first portion of the sequence of digital data bits into a measurement node when the control signal indicates a second action, the first portion of the sequence of digital data bits encompassing a boundary between the first digital data bit and the second digital data bit.

15. The method of claim 14, wherein using the differential circuit to discard the first portion of the sequence of digital data bits comprises:
activating a first switch to couple a first resistor into a first branch of the differential circuit when the control signal indicates the first action.

16. The method of claim 15, wherein using the differential circuit to couple the first portion of the sequence of digital data bits into the measurement node further comprises:
activating the first switch to uncouple the first resistor from the first branch of the differential circuit when the control signal indicates the second action; and
activating a second switch to route via the measurement node, when the control signal indicates the second action, a current that is associated with the first portion of the sequence of digital data bits.

17. The method of claim 16, further comprising:
using the measurement node for measuring one or more parameters of one or more transients when the one or more transients occur on a transitioning edge located at the boundary between the first digital data bit and the second digital data bit.

18. The method of claim 17, further comprising:
modifying one or more operating parameters of the digital-to-analog converter based on measuring the one or more parameters of the one or more transients, the modifying directed at addressing one or more of at least a current source mismatch, a clock duty cycle error, a control signal switching error, or a code-dependent error.

19. The method of claim 17, wherein using the measurement node for measuring the one or more parameters comprises:
   routing through a second resistor, the current associated with the first portion of the sequence of digital data bits; and
   measuring a voltage drop across the second resistor, the voltage drop indicative of an amplitude of at least one of the one or more transients that are a part of the transitioning edge.

20. The method of claim 17, wherein using the measurement node for measuring the one or more parameters comprises:
   measuring one or more timing characteristics of the one or more transients that are a part of the transitioning edge.

* * * * *